United States Patent [19]

Berghaeuser

[11] Patent Number: 5,166,523
[45] Date of Patent: Nov. 24, 1992

[54] DEVICE FOR BURNING IN LIGHT-SENSITIVE LAYERS IN THE PRODUCTION OF PRINTING FORMS

[75] Inventor: Guenter Berghaeuser, Wiesbaden, Fed. Rep. of Germany

[73] Assignee: Hoechst Aktiengesellschaft, Frankfurt am Main, Fed. Rep. of Germany

[21] Appl. No.: 654,582

[22] Filed: Feb. 13, 1991

[30] Foreign Application Priority Data

Feb. 14, 1990 [DE] Fed. Rep. of Germany ....... 4004511

[51] Int. Cl.⁵ .............................................. G03G 5/16
[52] U.S. Cl. ................................................. 250/316.1
[58] Field of Search ...................... 250/316.1, 318, 319

[56] References Cited

U.S. PATENT DOCUMENTS

| | | |
|---|---|---|
| 2,651,702 | 9/1953 | Burke et al. |
| 3,046,121 | 7/1962 | Schmidt .................................. 96/33 |
| 3,589,261 | 6/1971 | Krikelis ................................... 95/89 |
| 3,694,245 | 9/1972 | Anderson et al. ............... 250/316.1 |
| 4,265,999 | 5/1981 | Schell .................................. 430/189 |
| 4,334,755 | 6/1982 | Harrell et al. ....................... 354/299 |
| 4,487,827 | 12/1984 | Berghaeuser ....................... 430/302 |
| 4,698,504 | 10/1987 | Pelt ....................................... 250/319 |
| 5,045,697 | 9/1991 | Schneider ........................ 250/316.1 |

FOREIGN PATENT DOCUMENTS

| | | |
|---|---|---|
| 0061059 | 9/1982 | European Pat. Off. |
| 7202150 | 1/1972 | Fed. Rep. of Germany |
| 1447963 | 9/1972 | Fed. Rep. of Germany |
| 7805619 | 8/1978 | Fed. Rep. of Germany |
| 8810445 | 12/1988 | Fed. Rep. of Germany |
| 1330139 | 9/1973 | United Kingdom |
| 1413374 | 11/1975 | United Kingdom |
| 1555233 | 11/1979 | United Kingdom |

Primary Examiner—Bruce C. Anderson
Attorney, Agent, or Firm—Foley & Lardner

[57] ABSTRACT

A device for burning in positive-working light-sensitive layers containing diazo compounds in the production of printing forms comprises a radiation source whose radiation comprises an infrared fraction, a fraction in the visible region, and an ultraviolet fraction. In the device, a radiation absorber is provided which covers a heat reservoir. The back of the printing form is passed flat over the radiation absorber, which is maintained at a substantially constant temperatuer by the heat reservoir.

20 Claims, 2 Drawing Sheets

DEVICE FOR BURNING IN LIGHT-SENSITIVE LAYERS IN THE PRODUCTION OF PRINTING FORMS

BACKGROUND OF THE INVENTION

The invention relates to a device for burning in light-sensitive layers in the production of offset printing forms by heating the printing form by means of a radiation device which has an infrared fraction of about 50 to 87%, a fraction of about 10 to 30% in the visible region and an ultraviolet fraction of about 3 to 20% in the electromagnetic radiation.

In the case of positive-working light-sensitive layers, those parts of the light-sensitive layer struck by light during the imagewise exposure of the printing plate become relatively more soluble than the parts which have not been struck by light. As a result of the first mentioned parts being dissolved out in the developing step, the non-image areas of the later printing form, which are water-bearing on printing, are formed on the printing plate surface after the development of the exposed layer, and the image areas which are ink-bearing on printing are formed from the last-mentioned parts. In practice, it has been found that heating of the exposed and developed printing plate—to temperatures of about 180° C. and higher, depending on the type of the support material—from the side of the light-sensitive layer or also from the back can lead to longer print runs; this operation is termed 'burning-in' or 'baking'. Two factors appear to be decisive in this regard. On the one hand, a mechanical consolidation of the image areas takes place, so that these are less susceptible to damage during storage and printing, for example by the action of light. On the other hand, the image areas also become more resistant to chemical or physical-chemical attacks, which manifests itself, for example, in that the image areas are less readily attacked by printing inks containing organic solvents or by etching media than image areas which have not been burnt in.

The following processes and/or devices for burning in light-sensitive layers have, for example, been disclosed in the state of the art:

German Offenlegungsschrift 31 10 632 (EP-B-0,061,059) discloses a process for burning in exposed and developed, positive-working light-sensitive layers, containing diazo compounds, in the production of offset printing plates by heating the printing plate. The electromagnetic radiation of the radiation source contains an infrared fraction of 50 to 87%, a fraction of 10 to 30% in the visible range and an ultraviolet fraction of 3 to 20%, the printing plate being heated at least to 180° C.

In German Patent 854,890 (=U.S. Pat. No. 3,046,121), the aftertreatment of positive-working, light-sensitive layers containing diazo compounds by heating the printing plates carrying these layers is described. The heating is effected before or after the development of the exposed printing plate by treatment with flames, with a hot pressing iron, in a box electrically heated to elevated temperatures or between heated rollers; it is intended that the unexposed diazo compound is decomposed by the heating and the decomposition products are firmly bound to the support material.

German Auslegeschrift 1,447,963 (=British Patent 1,154,749) discloses a process for producing an offset printing form, wherein the printing plates having positive-working light-sensitive layers, which contain o-naphthoquinone-diazide compounds, are heated after development in the presence of a novolak and/or a resol to a temperature of at least 180° C. The resin is either already present in the light-sensitive layer, or it is applied in solution to the light-sensitive layer before the heating. The level of the heating temperature and the heating time are selected such that, as the result of the decomposition of the ink-bearing image areas, not struck by the light, a precipitate is formed on those parts of the printing plate which have been struck by light, i.e. removed by the developer, and are water-bearing during printing. By means of an aftertreatment, these parts of the printing plate, which are water-bearing during printing, are then cleaned again. The heating temperature is especially 200° to 250° C. The corresponding heating time is 5 to 60 minutes, the heating being carried out in a burning-in stove.

The device for the burning-in of printing plates with an exposed and developed diazo layer according to German Patent 1,955,378 (=British patent 1,330,139) runs at a heating temperature of at least 180° C. and contains, as the heating element, a quartz/halogen lamp having a radiation fraction of 10 to 15% in the visible spectral region. These quartz/halogen lamps are said to be distinguished by a relatively short heating-up time as compared with heating cabinets or infrared (IR) heating rods. As compared with IR heating rods, they have a considerably higher radiation fraction in the visible spectral region.

In the process for producing planographic printing forms according to German Offenlegungsschrift 2,201,936 (=British Patent 1,413,374), the exposed and developed light-sensitive layers are heated from the back of the printing plate by IR radiation, this back carrying an IR-absorbing layer.

In German Utility Model 6,901,603 (=U.S. Pat. No. 3,589,261) a device for developing negative-working, light-sensitive layers containing photopolymerizable compounds on flexible support materials is described, which also comprises (page 3, paragraph 4; page 5, paragraph 1, page 9, paragraph 4 and page 10) an aftertreatment stage, in which lamps emitting UV (ultraviolet) and IR light are used. In this stage, it is intended that, on the one hand, the material is dried after the main development stage and, on the other hand, an afterexposure of the remaining photopolymerizable parts in the image areas takes place.

German Utility Models 7,202,150 and 7,805,619 have disclosed that essentially three types of burning-in cabinets are used in practice for printing plates, namely horizontally or vertically operating circulating-air burning-in cabinets or vertically operating burning-in stoves with heating devices based on electromagnetic radiation; heating of the light-sensitive layer by placing the printing plates upon a heated cylinder is also possible.

The burning-in processes disclosed by the state of the art have, however, certain disadvantages. Devices which operate with a naked flame, or in which heated rollers are used, produce only insufficiently reproducible heat distributions with respect to the temperature generated, damage to parts of the printing plates can occur, and no uniform burning-in of the layer is accomplished. Devices in which, for example, heated circulating air is used in a heating cabinet, admittedly lead to a more reproducible temperature adjustment and to an evening-out of burning-in, but long heating-up times before and during the burning-in must be accepted and, especially in the case of printing plate support materials based on organic polymers or composed of aluminum, the mechanical strength (for example tensile strength) of the support materials can be adversely affected. Devices in which electromagnetic radiation with an exclusive or very high IR fraction is used admittedly can lead to a reduction of the treating time from at least 5 to 6 minutes in so-called burning-in cabinets to, for example, about 1 minute, especially if the distance between the light-sensitive layer and the heat source is reduced, but they cause then the undesired side effect of a very severe adverse affect on the mechanical strength of the printing plate support materials.

Although it was already known from the processing of exposed and developed, negative-working printing plates with photopolymerizable compounds in the light-sensitive layer to irradiate these with lamps emitting UV light and IR light in an "afterexposure stage", such a measure pursues different purposes. In fact, these lamps are intended to serve, on the one hand, for drying the material and, on the other hand, for an afterexposure of photopolymerizable fractions still remaining in the image areas. Since, in the case of negative-working light-sensitive layers, the parts of the layer struck by light become less soluble, the irradiation by the lamps having a UV fraction is intended to make those image areas or parts of image areas completely insoluble which are located, for example, in areas adjoining the surface of the support material which are further away from the light source in the actual exposure stage, to the extent that these were not yet or only insufficiently insoluble. This means, however, that this would not be a non-inventive transfer of this teaching to the burning-in of positive-working light-sensitive layers, since precisely opposite prerequisites prevail with these. Initially, it had to be assumed that an irradiation with UV light would have to lead to a higher solubility of the layer areas struck by light.

The invention starts from a device for burning in exposed and developed, positive-working light-sensitive layers containing diazo compounds in the production of printing forms by heating the printing plate by means of electromagnetic radiation having an infrared fraction, a fraction in the visible region and an ultraviolet fraction.

SUMMARY OF THE INVENTION

Accordingly, it is an object of the present invention to provide an improved device for burning in positive-working light-sensitive layers of printing plates of the type described at the outset, wherein uniform distribution of heat is established everywhere on the back of the printing form that faces away from the radiation source.

Another object of the present invention is to provide an improved device of the foregoing type which does not affect the mechanical and thermal properties of the support material of the printing form, especially of aluminum-based support materials.

Yet another object of the present invention is to provide an improved method for burning- in positive-working light-sensitive layers in the production of printing forms.

In accomplishing the foregoing objectives, there has been provided, in accordance with one aspect of the present invention, a device for burning in light-sensitive layers in the production of printing forms comprising: a radiation source for heating the printing forms, wherein the radiation source emits electromagnetic radiation having an infrared fraction of about 50 to 87%, a fraction of about 10 to 30% in the visible region and an ultraviolet fraction of about 3 to 20%; a radiation absorber disposed such that the printing forms are passed between the radiation source and the radiation absorber wherein the backs of the printing forms are guided flat over the radiation absorber and the layer sides of the printing forms are passed at a constant distance beneath the radiation source; and a heat reservoir which maintains a substantially uniform heat distribution, wherein the heat reservoir is covered by the radiation absorber and maintains a substantially constant temperature in the radiation absorber.

In accordance with another aspect of the present invention, there is provided a method for burning-in light-sensitive layers in the production of printing forms comprising the steps of: passing the printing forms between a radiation source which emits electromagnetic radiation having an infrared fraction of about 50 to 87%, a fraction of about 10 to 30% in the visible region and an ultraviolet fraction of about 3 to 20%, and a radiation absorber, whereby the backs of the printing forms are guided flat over the radiation absorber and the layer sides of the printing forms are passed at a constant distance beneath the radiation source; and simultaneously maintaining a substantially constant temperature in the radiation absorber by means of a heat reservoir which is covered by the radiation absorber and which has a substantially uniform heat distribution.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention will be explained in more detail below by reference to the drawings, in which.

DETAILED DESCRIPTION OF THE PREFERRED EMBODIMENTS

Figure 1:
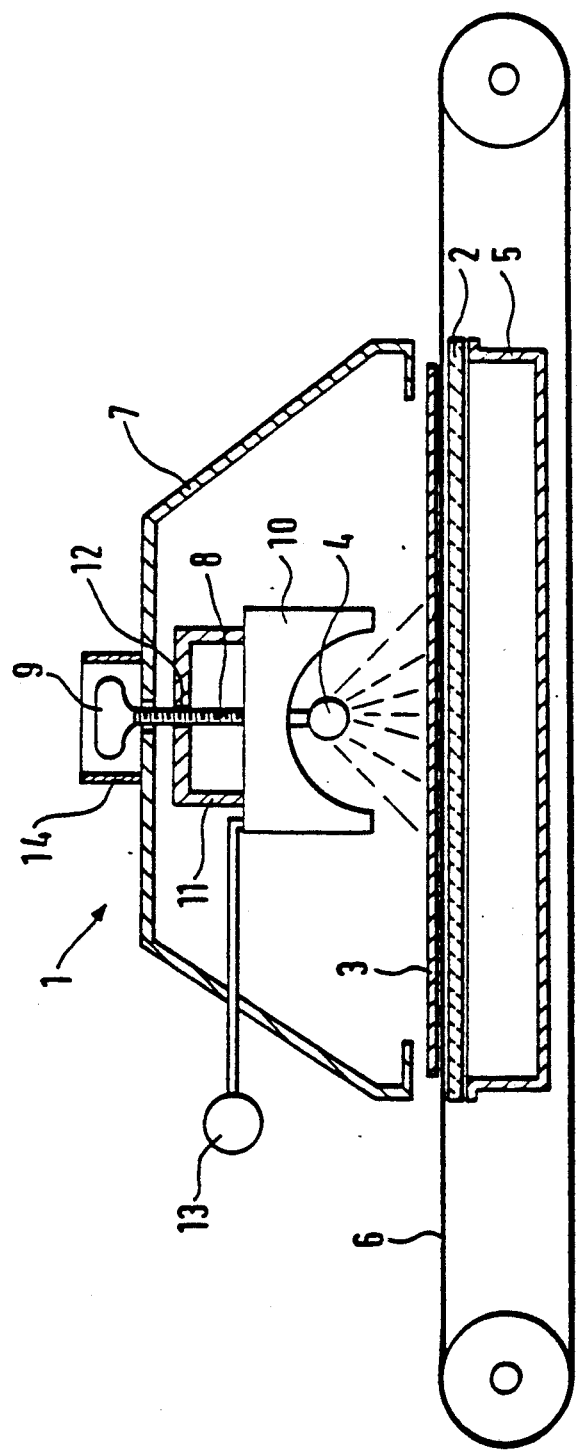
FIG. 1 shows a diagrammatic cross-section through a first embodiment of a device according to the invention.

According to the invention, there is provided a device for burning in light-sensitive layers in the production of printing forms by heating the printing form by means of a radiation source which has an infrared fraction of about 50 to 87%, a fraction of about 10 to 30% in the visible region and an ultraviolet fraction of about 3 to 20%, wherein a radiation absorber is provided, over which the back of the printing form is guided flat, while the layer side thereof is moved past underneath the radiation source at a constant distance, and wherein the radiation absorber covers a heat reservoir, which keeps the heat distribution uniform and keeps the temperature in the radiation absorber largely constant.

The device can in principle be used for any offset printing plate which contains at least one diazo compound as the light-sensitive component in the positive-working light-sensitive layer, these compounds in particular being esters or amides of o-naphthoquinone-diazide sulfonic acids or o-naphthoquinone-diazide-carboxylic acids (see for example, German Auslegeschrift 1,447,963 already mentioned in the outset). In addition to the diazo compound component, the light-sensitive layers normally also contain a resin, especially a novolak and/or a resol, but various further components such as dyes or adhesion promoters can also be present.

The support materials used for the light-sensitive layers can be those usually employed in offset printing technology, which include especially metal foils based on aluminum, zinc or steel, apart from the films of organic polymers, such as polyesters, which are less suitable for burning-in processes because of their composition which in general is insufficiently heat-stable. Preferably, aluminum plates are used which have been chemically, mechanically or electrochemically roughened and, as desired, also carry an alumina layer. Frequently, the printing plate support material is also modified additionally on the surface before the light-sensitive layer is applied, for example by means of aqueous solutions of polyvinylphosphonic acid or sodium silicate.

In the burning-in practice, the most diverse auxiliaries can also be used before and/or after the thermal treatment step. These include, for example: aqueous hydrofluoric acid, aqueous trisodium phosphate solution, aqueous phosphoric acid or aqueous fluoboric acid for removing the impurities formed during burning-in on the non-image areas of the printing plate, or aqueous phosphoric acid for rendering the non-image areas hydrophilic before burning-in, according to German Auslegeschrift 1,447,963 (=British Patent 1,154,749); aqueous solutions of water-soluble organic substances such as gum arabic, cellulose ethers, polyacrylic acids, salts of organic acids or anionic surfactants such as alkylarylsulfonates, and/or of water-soluble inorganic salts such as halides, borates, phosphates or sulfates for modifying the entire plate surface (with a particular hydrophilic effect on the non-image areas) before the burning-in, according to German Offenlegungsschrift 2,626,473 (British Patent 1,555,233); also an aqueous solution of polyvinylphosphonic acid for removing the impurities formed during burning-in from the non-image areas of the printing plate, according to German Offenlegungsschrift 2,855,393.

Turning now to the drawing, FIG. 1 shows a cross-section through a first embodiment of a device 1 for the burning-in of light-sensitive layers on the surfaces of printing plates. The device 1 has a housing 7 which surrounds the part of the device 1 which is located above the wire mesh web 6. The wire mesh web 6 is an endless revolving wire mesh web on which the coated support material, namely a printing form 3, rests and is passed through underneath a radiation source 4 which is enclosed by the housing 1. The radiation source 4, for example, a mercury vapor lamp, of the type used as UV emitters, is arranged in such a way that its entire emission of UV, IR and visible radiation can act without protection onto the printing form 3 passing through underneath. The radiation source 4 has a variable electric power consumption of up to about 15 kW at most and is at least partially surrounded by a reflector 10. Underneath the wire mesh web 6, there is a radiation absorber 2 which covers a heat reservoir 5. During the transport through the device 1, the printing form 3 rests on the wire mesh web 6 which is guided flat over the radiation absorber 2. The layer side of the printing form 3 is moved past underneath the radiation source 4 at a constant distance.

For the radiation absorber 2, which is a plate of a heat-resistant glass-ceramic material having a coefficient of thermal expansion $\alpha$ from about $-0.15 \times 10^{-6}$ $K^{-1}$ to $0.10 \times 10^{-6}$ for a temperature range from about 20° to 700° C., commercially available glass-ceramic materials, for example those made by Schott, Mainz, Federal Republic of Germany, or other industrial ceramics can in general be used.

By means of the heat reservoir 5, which is covered by the radiation absorber 2, uniform heat distribution in the radiation absorber is achieved and the temperature in the radiation absorber is kept constant. As already mentioned above, the radiation absorber additionally enables the wire mesh web 6 with the printing form 3 lying on it to be moved past flat underneath the radiation source 4. In the exposure pauses, i.e. when no printing form 3 rests on the wire mesh web 6, the radiation absorber 2 receives the emission of the radiation source 4, and, inter alia, prevents scattered light inside the housing 7 and thus the undesired heating of parts within the housing 7.

The wire mesh web 6 is guided around the heat reservoir 5 in such a way that the upper section of the wire mesh web runs above the radiation absorber 2 and the lower section of the wire mesh web runs along the underside of the heat reservoir 5.

The radiation absorber 2 can, for example, have a dark color and have a surface with a slight structuring. The thickness of the radiation absorber 2 is about 3 to 5 mm.

The heat reservoir 5 comprises, for example, a sheet metal trough having a height of about 5 to 7 cm. The heat reservoir 5 is filled with a material which may be a gas such as air or a solid material such as quartz sand or fireclay bricks. The back, facing away from the radiation, of the printing form 3 is thermally insulated by the filling of the heat reservoir 5. If a static air cushion is present as filling in the heat reservoir 5, the heat distribution in the radiation absorber 2 is evened out in this way to a particularly high degree. In order to obtain a high degree of evening-out of the heat distribution in the radiation absorber, the back of the radiation absorber 2, which rests on the wire mesh web 6, can also be heated, for example electrically.

The radiation absorber 2 in the form of a heat-resistant glass-ceramic material or other industrial ceramic automatically guarantees ideal flat guiding of the wire mesh web 6 and thus of the printing form 3 and, furthermore, a material is used which neither distorts nor heats up unduly and at the same time provides an almost ideally uniform heat distribution on the printing form 3.

The radiation source 4 is arranged at a fixed preset distance from the wire mesh web 6 within the housing 7. This fixed preset distance depends on the particular type of printing plate, i.e. above all on the light-sensitive layer of the printing form 3. Starting from the fixed preset distance of the radiation source 4 from the printing form 3, the radiation source 4 can be adjusted in height or in its distance from the printing form 3 within a range from 0 to about 25 cm. For this purpose, a spindle 8 is provided which is taken through the housing 7 and is fitted outside the housing with a handle 9. Inside the housing, the spindle is in engagement with the holder 11 of the reflector 10 of the radiation source 4. The holder 11 has the shape of a bracket, both ends of which are rigidly joined to the reflector 10. In the middle of the holder 11 there is a threaded bore 12, through which the spindle 8 is taken. The thread of the threaded bore 12 is in engagement with the spindle. By turning the spindle 8 clockwise or anticlockwise, the holder 11 is lowered or lifted, and the distance of the radiation source 4 from the printing form 3 is adjusted in this way. The reflector 10 can be made of a glass ceramic material or another ceramic. In the case of a glass reflector 10, a fan 13 for cooling the reflector 10 is directly joined thereto. In fact, if the reflector 10 is not cooled, deformations of the metal holder can occur, whereby a considerable influence is exerted on the radiating characteristics of the reflected radiation of the radiation source 4, which is disadvantageous for the evening-out of the radiation distribution. If the reflector 10 is made of a glass-ceramic material or another industrial ceramic (cf. FIG. 2), such as is also used for the radiation absorber 2, such a fan can be omitted, since these ceramics have a substantially higher heat resistance than metals and therefore hardly deform under the action of heat.

On the upper side of the housing 7, an extraction branch 14 is provided which is connected to an extraction fan which is not shown, in order to extract the constituents released when the light-sensitive layer of the printing form 3 is burnt in, and the ozone formed in the device 1 by the UV fraction of the radiation.

Figure 2:
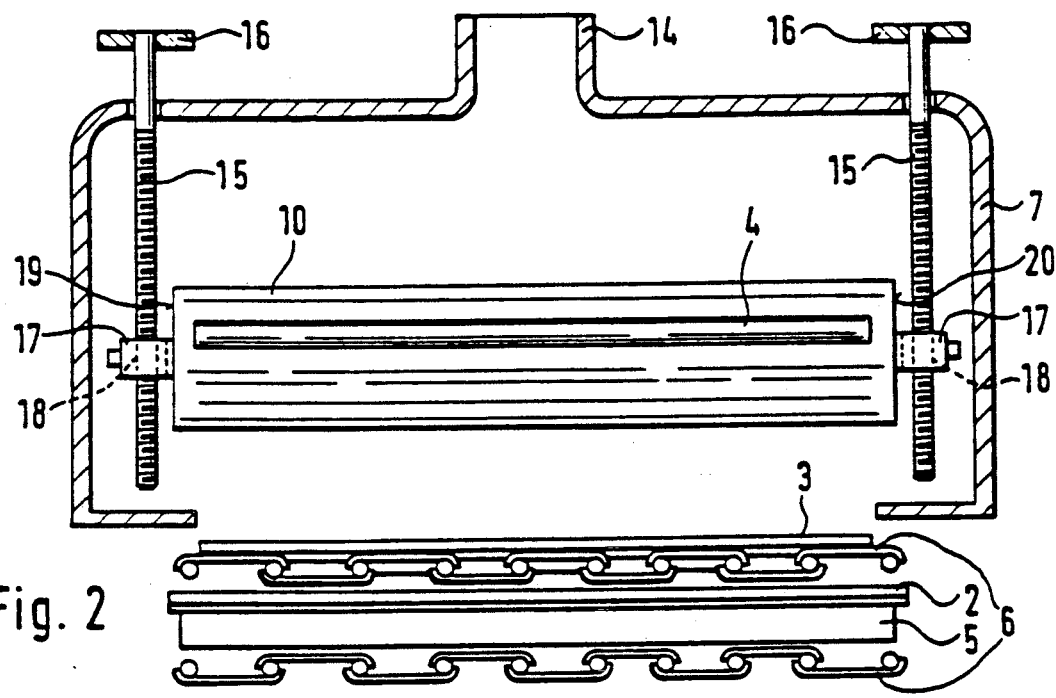
FIG. 2 shows a diagrammatic longitudinal section through a second embodiment of a device according to the invention.

FIG. 2 shows a second embodiment of the device 1 according to the invention, which differs from the first embodiment of the device according to FIG. 1 only by the vertical adjustment of the radiation source 4 together with the reflector 10. In FIG. 2, the radiation source 4 and the reflector 10 are shown in longitudinal section. The reflector 10 is made of a glass-ceramic material or another industrial ceramic, as was already mentioned above in connection with the first embodiment of the device 1. The surface of the glass-ceramic material or other ceramic of the reflector 10 is coated with a thin metal layer of gold, platinum, silver, aluminum, copper or another reflecting metal. This design of the reflector 10 for the radiation source 4 makes cooling of the reflector by means of a fan unnecessary. The adjustment of the radiation source 4 together with the reflector 10 is effected by means of two spindles 15 which are taken through the housing 7 of the device 1 and are each fitted with a handle 16. The spindles 16 are arranged parallel to the broad sides 19, 20 of the reflector 10 and are in engagement with threads in little blocks 17, 17 which are rigidly joined to the broad sides 19, 20. The symmetrical arrangement of the spindles 15 makes it possible to adjust the height of each broad side of the reflector 10 by itself, i.e. to control the distance from the printing form 3 individually. As a result, it is possible to compensate to a certain extent for irregularities in the radiating characteristics of the radiation source 4, which can arise after a prolonged operating period, by different distance adjustments of the broad sides 19, 20 of the reflector 10 relative to the printing form 3 or, in other words, by a slight inclination of the radiation source 4 relative to the passage plane of the printing form 3. The housing 7 of the second embodiment is, like the first embodiment, fitted with an extraction branch 14. The other components of the second embodiment are largely identical to the corresponding components of the first embodiment and are therefore not described once more.

Figure 3:
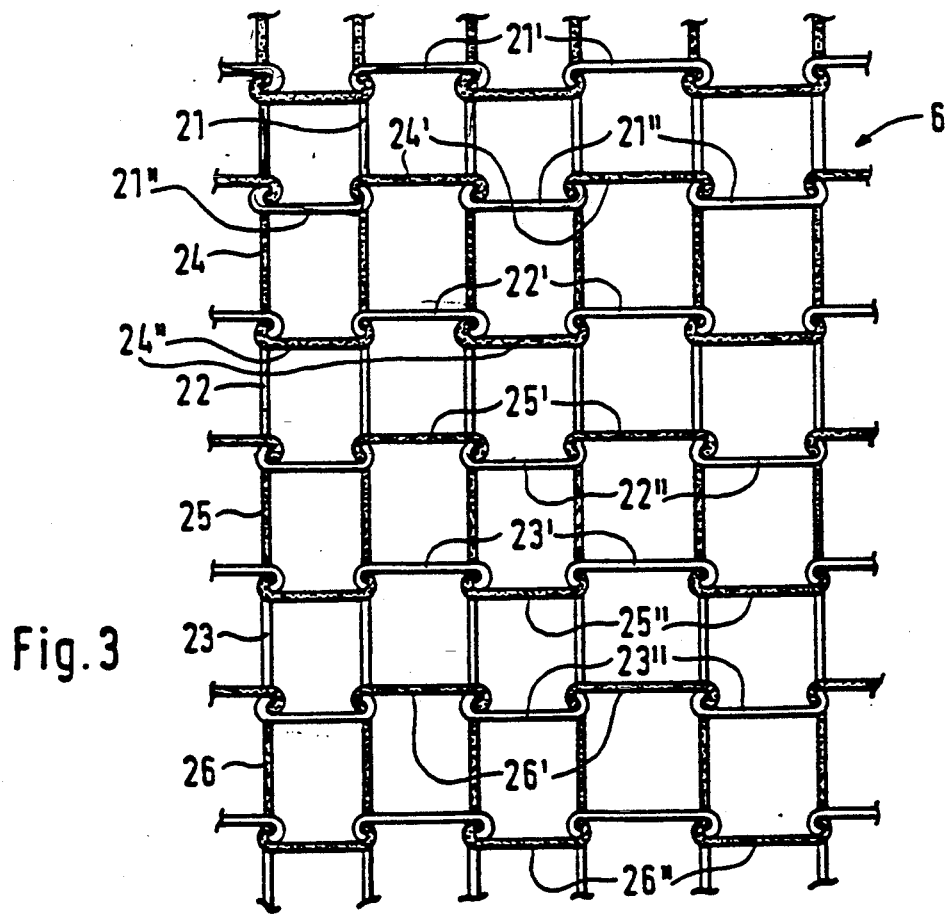
FIG. 3 shows a plan view of a wire mesh web which is used in the device according to FIG. 1 to 2.

FIG. 3 shows a plan view of the wire mesh web 6, such as is used in both embodiments of the device 1 according to the invention. This wire mesh web 6 is composed of two groups of mutually parallel wires 21, 22, 23 and 24, 25, 26. Each of these wires has a shape made up of rectangular or square parts 21', 22', 23', 24', 25', 26' of equal size which are open downwards. These rectangular or square parts are mutually connected by straight wire sections 21", 22", 23", 24", 25", 26" of equal size. The shape of the individual wire is most readily comparable with an electromagnetic wave of rectangular or square pulses. The wires 21, 22, 23, 24, 25, 26 are braided in one another and form the braided structure of the wire mesh web 6. The braiding is explained in more detail by reference to three adjacent wires 21, 24 and 22. The horizontal leg of the left-hand, first rectangular part 24" of the wire 24 surrounds the two vertical legs of the first rectangular part 21' of the wire 21 from the front in the region of their horizontal bends. The downward-pointing vertical legs of the first rectangular part 24' are taken downwards behind the horizontal sections 21" of the wire 21. The second rectangular part 24' of the wire 24 is braided with the second rectangular part 21' of the wire 21 in the same way.

The braiding of the wire 24 with the wire 22, arranged underneath the latter, is effected in the same order as described above, i.e. the horizontal leg of the left-hand, first rectangular part 22' of the wire 22 is located in front of the two vertical legs of the first rectangular part 24' in the region of their horizontal bends. The downward-pointing vertical legs of the first rectangular part 22' run behind the vertical legs of the first rectangular part 24'. The horizontal wire sections 24" of the wire 24 are located in front of the vertical legs 22'.

This braiding continues across the entire wire mesh web 6.

The electromagnetic radiation having an IR fraction, a fraction in the visible region and a UV fraction can be generated by means of conventional lamps which emit UV radiation, such as are otherwise used for the exposure of light-sensitive layers on printing plates or of photoresists. Similar lamps are also used in devices for artificial tanning, e.g. in tanning studios or "home sunlamps". Preferably, lamps are used whose electromagnetic radiation has an infrared fraction of about 50 to 87%, a fraction of about 10 to 30% in the visible region and an ultraviolet fraction of about 3 to 20%.

The UV region is here meant to include wavelengths from about 100 nm to about 380 nm, and the IR region is meant to include wavelengths from about 780 nm to about 1 mm. Lamps suitable for this purpose are especially mercury vapor lamps which can also additionally contain a certain fraction of metal halides such as iron iodide or gallium iodide. The indicated region for the IR fraction relates to air-cooled lamps, and the IR fraction decreases significantly, for example, in the case of water-cooled lamps.

A device according to the invention can be operated continuously or also discontinuously, the exposed and developed layer advantageously being arranged during the burning-in equidistantly from the electromagnetic radiation source or being moved past the latter equidistantly, and the printing plate being irradiated from the layer side in order to minimize the thermal stress on the layer support. The back of the plate is brought, via a metal web, into contact with a heat reservoir or a radiation absorber.

In a device according to the invention, the electromagnetic radiation acts simultaneously and uniformly on the entire surface of the exposed and developed layer, whereby particularly uniform burning-in of all image areas of the printing plate and the highest possible thermal efficiency are achieved.

Improved utilization of the incident thermal energy can be achieved if the absorption capacity of the exposed and developed layer for IR radiation is enhanced by the addition of an absorption aid.

Using a device according to the invention, positive-working light-sensitive layers can be burnt in very uniformly within a relatively short time, without at the same time the mechanical properties of the support materials of these layers being adversely affected to a significant extent; this is achieved even with action times of the radiation from about 15 to 90 seconds only, depending on the distance from the radiation source and on the type of the coating and support material.

In the examples which follow, parts by weight are in the same relationship to parts by volume as the g to $cm^3$, and the percentage data are those in percent by weight. Known printing plates of the following structure are used:

Type 1 printing plate

A mechanically roughened aluminum foil is coated with a solution of 1.5 parts by weight of the condensation product of 2,3,4-trihydroxy-benzophenone and 1,2-naphthoquinone-2-diazide-5-sulfochloride, 0.8 part by weight of the condensation product of 1 mol of 2,2'-dihydroxy-1,1'-dinaphthylmethane and 2 mol of 1,2-naphthoquinone-2-diazide-5-sulfochloride, 0.6 part by weight of a novolak prepared by condensation of a technical-grade cresol mixture with formaldehyde and having a softening point from 108° to 118° C. (according to DIN 53 181), and 120 parts by volume of ethylene glycol monomethyl ether, using a rotating support for whirling off the excess quantity of the solution applied.

Type 2 printing plate

An electrolytically roughened and anodically oxidized aluminum foil is coated with a solution of 2.17 parts by weight of 4-(2-phenyl-prop-2-yl)-phenyl 1,2-naphthoquinone-2-diazide-4sulfonate, 1.02 parts by weight of the condensation product of 1 mol of 2,2'-dihydroxy-1,1'-dinaphthylmethane and 2 mol of 1,2-naphthaquinone-2-diazide-5-sulfochloride, 0.37 part by weight of 1,2-naphthoquinone-2-diazide-4-sulfochloride, 0.12 part by weight of crystal violet base, 9.90 parts by weight of a cresol/formaldehyde novolak having a softening range from 112° to 118° C. (according to DIN 53, 181), 43 parts by volume of tetrahydrofuran, 35 parts by volume of ethylene glycol monomethyl ether and 9 parts by volume of butyl acetate.

COMPARISON EXAMPLE 1

One printing plate each of types 1 and 2 having a size of 1030×800 mm and a thickness of 300 μm is exposed, developed and subjected for 5 to 6 minutes to hot circulating air of a temperature of 240° C. in a commercially available burning-in cabinet. The stability of the burnt-in image areas of the printing form is tested by allowing a mixture of various organic solvents (based on acetic anhydride, xylene and dimethylformamide) to act thereon. In the case of the shorter burning-in time, the image areas of both printing plate types are still soluble, whereas the image areas of the samples burnt in for 6 minutes are not incipiently dissolved even after 5 minutes action time of the solvent mixture. During this burning-in time, the tensile strength of the support material decreases from 165 $N/mm^2$ to 140 $N/mm^2$ (loss of about 15%).

COMPARISON EXAMPLE V 2

One printing plate each of types 1 and 2 having a size of 1030×820 mm and a thickness of 0.3 mm is pretreated as in Comparison Example V 1, passed through at a passage speed of 1 m/minute at a distance of 8 cm under a commercially available rod-type IR burner and subjected to a temperature of 230° C. In testing the stability of the image areas in accordance with the data in Comparison Example V 1, these are still just slightly incipiently dissolved, i.e. after 5 minutes action time. The support material shows extensive distortions. With this burning-in, its tensile strength decreases from 165 $N/mm^2$ to 82 $N/mm^2$ (loss of 50%). Due to the disturbance of the flat position and due to the inadequate burning-in, this printing form is unsuitable for use.

EXAMPLE 1

One printing plate each of types 1 and 2 having a size of 1030×820 mm and a thickness of 0.3 mm is pretreated as in Comparison Example V 1, and exposed at a passage speed of 1 m/minute at a distance of 8 cm to the total emission of a rod-type mercury vapor lamp, such as is used for hardening UV printing inks.

In the stability test according to the data in Comparison Example V 1, the image areas are no longer soluble.

During this burning-in, the tensile strength of the support material decreases from 168 $N/mm^2$ only to 158 $N/mm^2$ (loss of about 6%), and the flat position is only insignificantly affected.

EXAMPLE 2

A printing plate of type 2 is pretreated as in Comparison Example V 1, and one half is subjected for 8 minutes to a temperature of 230° C. in a commercially available burning-in cabinet, and the other half is subjected according to Example 1 to the emission of a mercury vapor burner at a passage speed of 1.0 m/minute.

Temperature measurement gauges stuck to the backs of both parts show that a temperature of 230° C. was reached.

With both printing forms, it is possible to produce about 80,000 good prints on a commercially available offset printing press having a damping unit which is operated with an isopropanol/water mixture, i.e. burning-in of positive-working, light-sensitive layers by the process according to the invention gives comparable results in printing from these layers at a significantly shorter burning-in time, with protection of the support material, at the same layer composition.

What is claimed is:

1. A device for burning in light-sensitive layers in the production of printing forms comprising:
   a radiation source within a housing for heating said printing forms, wherein said radiation source emits electromagnetic radiation having an infrared fraction of about 50 to 87%, a fraction of about 10 to 30% in the visible region and an ultraviolet fraction of about 3 to 20%;

a flat radiation absorber which in the exposure pauses receives the emission of said radiation source and prevents scattered light inside said housing and heating of parts within said housing, disposed such that said printing forms are passed between said radiation source and said radiation absorber, wherein the backs of said printing forms are guided flat over said radiation absorber and the layer sides of said printing forms are passed at a constant distance beneath said radiation source;

a heat reservoir which maintains a substantially uniform heat distribution, wherein said heat reservoir is covered by said radiation absorber and maintains a substantially constant temperature in said radiation absorber heated by the emission of said radiation source.

2. A device as claimed in claim 1, further comprising an endless revolving wire mesh web on which said printing forms rest while passing through said device, wherein the upper section of said wire mesh web passes above said radiation absorber and the lower section of said wire mesh web passes beneath the underside of said heat reservoir.

3. A device as claimed in claim 2, wherein the back of said radiation absorber, resting on said wire mesh band, is heated.

4. A device as claimed in claim 3, wherein said reflector is coated with a metal selected from the group consisting of gold, platinum, silver, aluminum and copper.

5. A device as claimed in claim 1, wherein said radiation absorber is a plate of a heat-resistant glass-ceramic material having a coefficient of thermal expansion $\alpha$ from about $-0.15 \times 10^{-6} K^{-1}$ to $0.10 \times 10^{-6} K^{-1}$ for a temperature range from about 20° to 700° C.

6. A device as claimed in claim 5, wherein the thickness of said radiation absorber is in the range from about 3.0 to 5.0 mm.

7. A device as claimed in claim 1, wherein said heat reservoir comprises a trough filled with a substance which thermally insulates the back of the printing form facing away from the radiation from said radiation source.

8. A device as claimed in claim 7, wherein said substance is a static air cushion which evens out the heat distribution in said radiation absorber.

9. A device as claimed in claim 7, wherein said substance is quartz sand.

10. A device as claimed in claim 7, wherein said trough is a sheet metal trough having a height of about 5 to 7 cm which is filled with a gas or a solid material.

11. A device as claimed in claim 1, wherein said radiation source has a variable electric power consumption of up to about 10 kW and is height-adjustable in a range from 0 to about 25 cm, starting from a fixed preset distance from said wire mesh web.

12. A device as claimed in claim 1, further comprising a reflector at least partially surrounding said radiation source.

13. A device as claimed in claim 12, further comprising:

a holder for said reflector attached to said reflector; and a spindle for the height adjustment of said reflector and said radiation source which passes through said housing and engages inside said housing with said holder, and which is fitted with a handle outside said housing.

14. A device as claimed in claim 13, wherein said holder has the shape of a bracket which is rigidly joined to said reflector and wherein said holder has a threaded bore in the middle thereof, through which said spindle is taken, said spindle engaging with the thread thereof.

15. A device as claimed in claim 13, wherein said reflector is comprised of metal, and wherein a fan for cooling said reflector is provided.

16. A device as claimed in claim 13, wherein said reflector is comprised of glass-ceramic or other ceramic material.

17. A device as claimed in claim 12, wherein said reflector has two parallel sides, and wherein said device further comprises:

two blocks having threaded bores, one of said blocks being rigidly joined to each of said two parallel sides of said reflector; and two spindles for the height adjustment of said reflector together with the radiation source, arranged parallel to said parallel sides of said reflector, which pass through said housing and engage inside said housing with said threaded bores of said blocks, and which are fitted with handles outside said housing.

18. A device as claimed in claim 1, wherein said heat reservoir does not contain heating means.

19. A device as claimed in claim 1, wherein said printing form comprises a positive-working light-sensitive layer containing a diazo compound.

20. A device as claimed in claim 1, further comprising an extraction branch on the upper side of said housing.

* * * * *